(12) United States Patent
Depetro et al.

(10) Patent No.: US 6,906,389 B2
(45) Date of Patent: Jun. 14, 2005

(54) HIGH-VOLTAGE, HIGH-CUTOFF-FREQUENCY ELECTRONIC MOS DEVICE

(75) Inventors: Riccardo Depetro, Domodossola (IT); Anna Ponza, Cornedo Vincentino (IT); Antonio Gallerano, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/237,553

(22) Filed: Sep. 9, 2002

(65) Prior Publication Data

US 2003/0067036 A1 Apr. 10, 2003

(30) Foreign Application Priority Data

Sep. 10, 2001 (EP) .......................................... 01830574

(51) Int. Cl.⁷ .............................................. H01L 23/76
(52) U.S. Cl. .................... 257/401; 257/341; 257/374; 257/389; 257/409; 257/395; 257/346
(58) Field of Search ................................ 257/341, 374, 257/389, 409, 395, 401, 346, 350, 343, 355, 362, 500, 531, 539, 547, 577, 546, 65, 328, 381, 387

(56) References Cited

U.S. PATENT DOCUMENTS 4,399,449 A  8/1983 Herman et al. .............. 357/53

5,912,495 A * 6/1999 Depetro et al. .............. 257/355
6,093,588 A * 7/2000 De Petro et al. ............ 438/180
2001/0038125 A1 * 11/2001 Ohyanagi et al. ........... 257/347

FOREIGN PATENT DOCUMENTS

EP          0 047 392 A2    3/1982

* cited by examiner

*Primary Examiner*—Minhloan Tran
*Assistant Examiner*—Tan Tran
(74) *Attorney, Agent, or Firm*—Lisa K. Jorgenson; Robert Iannucci; Seed IP Law Group PLLC

(57) ABSTRACT

An MOS electronic device is formed to reduce drain/gate capacity and to increase cutoff frequency. The device includes a field insulating layer that covers a drain region, delimits an active area with an opening, houses a body region in the active area, and houses a source region in the body region. A portion of the body region between drain and source regions forms a channel region. A polycrystalline silicon structure extends along the edge of the opening, partially on the field insulating and active layers. The polycrystalline silicon structure includes a gate region extending along a first portion of the edge on the channel region and partially surrounding the source region and a non-operative region extending along a second portion of the edge, electrically insulated and at a distance from the gate region.

23 Claims, 2 Drawing Sheets

HIGH-VOLTAGE, HIGH-CUTOFF-FREQUENCY ELECTRONIC MOS DEVICE

BACKGROUND OF THE INVENTION

1. Field of the Invention

The present invention relates to a high-voltage, high-cutoff-frequency electronic metal-oxide semiconductor (MOS) device. Hereinafter, reference will be made, without limitation, to a DMOS device.

2. Description of the Related Art

As is known, double-diffused metal-oxide semiconductor (DMOS) high-voltage devices (with a voltage higher than 20 V) have a limited cutoff frequency. However, there are some applications where a high cutoff frequency is requested, as for example in telecommunications and especially in wireless appliances. To try to overcome this inconvenience, suitable technological solutions are studied to reduce the parasitic capacities associated with the devices. In fact, in DMOS devices, the cutoff frequency $F_t$ is given, in a first approximation, by:

$$F_t = \frac{g_m}{2\pi C_{gd}} \quad (1)$$

where $g_m$ is the transconductance of the device and $C_{gd}$ is the parasitic capacity existing between the gate electrode and the drain region.

From (1) it is clear that, to maximize the cutoff frequency $F_t$, it is necessary to maximize the transconductance $g_m$ and/or to minimize the parasitic capacity $C_{gd}$.

The optimization of the parameter in the numerator is easy in case of power structures, which have a large channel perimeter; in fact in this case it is possible to maximize the perimeter of the integrated device with the minimum length of the channel, for example making structures wherein the source is completely surrounded by the drain region, so as to obtain the maximum transconductance $g_m$ associated with the respective parasitic capacity $C_{gd}$.

In contrast, in the case of minimum structures (that is structures designed with the minimum dimensions compatible with the existing voltage requirements), the layout is never optimized as regards the cutoff frequency. In fact, these structures present field edge structures forming field plates and are generally formed by the gate polysilicon so as to reduce the electric field associated with the geometric discontinuity constituted by the field oxide (tip effect).

These edge structures surround the whole source region so as to ensure that the device withstands the high voltages. An example of DMOS with a field plate of the type described is shown in FIG. 1, where a pocket 1 of N-type, forming a drain region, is surrounded by an insulating structure 2, made in any way. A field oxide layer 3 extends on top of the pocket 1 and has a first opening 8, which surrounds an active area 4 and a second opening 5 where a drain contact region 6 is formed, of N⁺-type. A body region 10, of P-type, is formed in the active area 4 and houses a source region 11, of N⁺-type, and a body contact region 12, of P⁺-type. A gate region 15 extends along the whole edge of the first opening 8, partly on the bird's beak-shaped portion of the field oxide layer 3, partly on top of the active area 4. The gate region 15 is electrically insulated, with respect to the pocket 1, by a thin gate oxide layer, not shown, and therefore forms, with the pocket 1, a parasitic capacity $C_{gd}$, represented by dashed lines. The source region 11 and the body region 10 (through the body contact region 12) are electrically connected through a source/body contact line SB; the gate region 15 is biased through a gate contact G and the N-pocket is biased through a drain contact D formed on the drain contact region 6.

FIG. 2 shows the profile of the masks used for forming the device of FIG. 1; in particular, 20 indicates the drain mask; 21 the active area mask; 22 the gate mask; 23 the source mask and 24 the body contact mask. The gate region 15 is dashed, to show its overall form, as a closed loop. The mask used for forming the body region 10 is not visible, since it coincides with the three outer sides of masks 23 and 24. FIG. 2 further shows the drain contact D as well as the source contacts S and body contacts B connected to the source/body contact line SB.

In the device in FIG. 1, in presence of a large parasitic capacity $C_{gd}$ (due to the large facing area between the gate region 15 and the drain region—pocket 1—), there is a low transconductance (since the only channel active part is the portion of the body region 10 arranged between the source region 11 and the pocket 1, below the gate region 15; the portion of the body region 10 arranged between the body contact region 12 and the pocket 1 does not contribute to the formation of the device channel.

This conformation therefore does not allow a high cutoff frequency; consequently, while a power device has for example, in a 200 V technology with a silicon-on-insulator (SOI) substrate, a cutoff frequency $F_t$=3.2 GHz, a minimum type device of the same voltage class has a cutoff frequency $F_t$=2.26 GHz (exactly proportional to the ratio $g_m/C_{gd}$).

BRIEF SUMMARY OF THE INVENTION

Embodiments of the invention allow an increase of the cutoff frequency of a high-voltage device of the minimum-geometry type a high voltage MOS device.

In particular, dividing the polysilicon region in two parts so as to disconnect the non-operative part (which forms only a field plate) from the electrically operative part, the facing area between the gate region and the drain region is reduced, and so the parasitic capacity $C_{gd}$ is reduced. Thereby, an increase of the cutoff frequency is obtained (which becomes equal to that of the power device), without increasing the overall area of the device.

BRIEF DESCRIPTION OF THE SEVERAL VIEWS OF THE DRAWING(S)

For an understanding of the present invention, an exemplary embodiment is now described, purely as an example without limitation, with reference to the enclosed drawings, wherein.

DETAILED DESCRIPTION OF THE INVENTION

Figure 1:
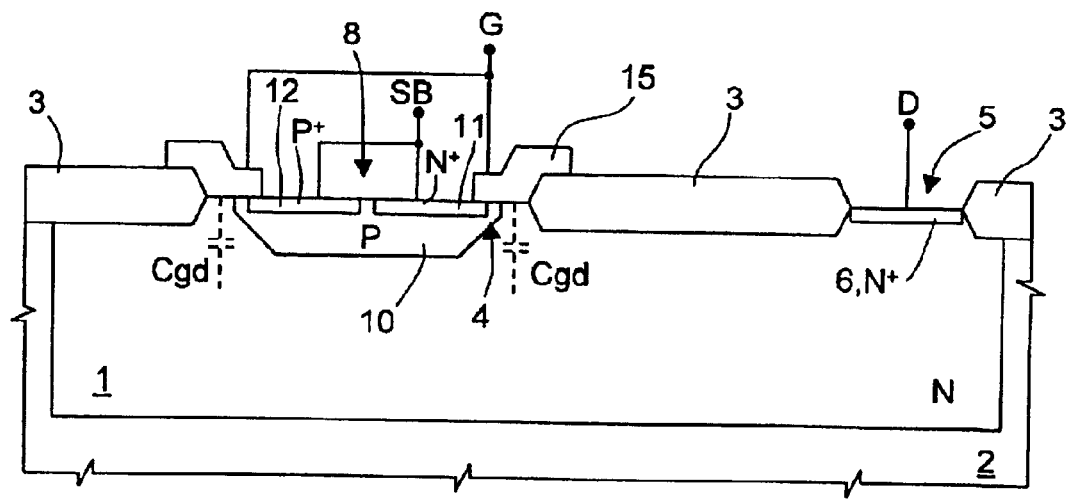
FIG. 1 shows a cross-section through a high-voltage, minimum-geometry MOS device of a known type.
Figure 2:
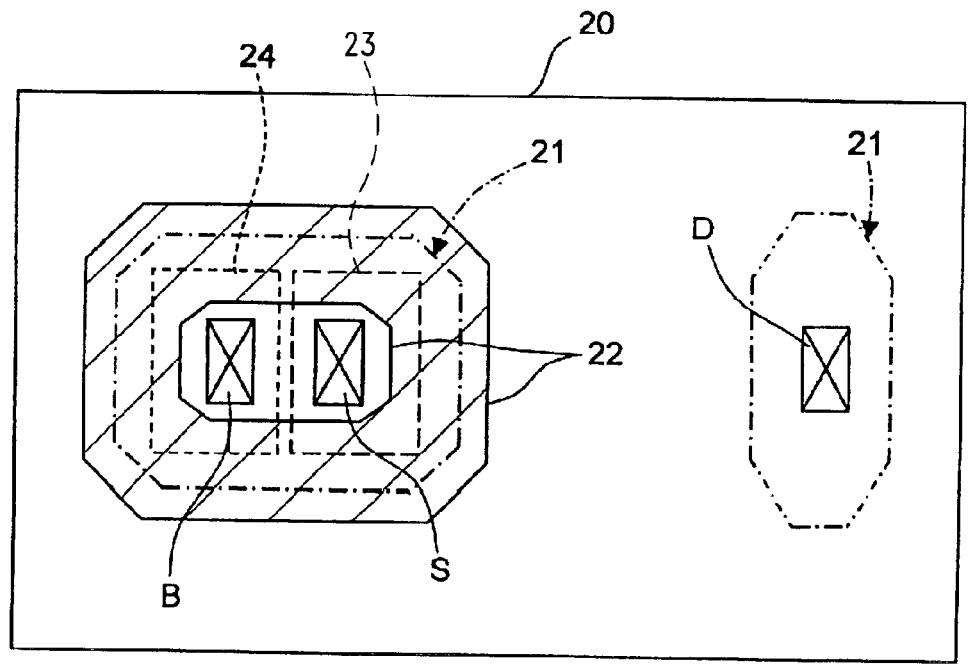
FIG. 2 shows the layout of the masks used for the known device of FIG. 1.
Figure 3:
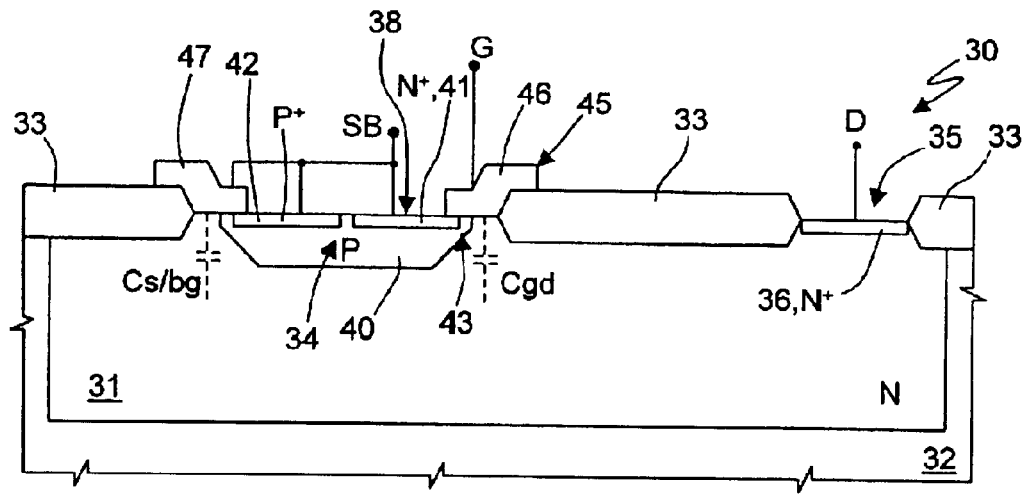
FIG. 3 shows a cross-section through a high voltage MOS device according to an exemplary embodiment of the invention.

In FIG. 3, a high voltage MOS device is indicated as a whole by 30 and comprises a pocket 31 of N-type surrounded by an insulating structure 32. A field oxide layer 33 extends on top of the pocket 31 and has a first opening 38 that surrounds an active area 34 and a second opening 35 where a drain contact 36, of N⁺-type is formed. A body region 40, of P-type, is formed in the active area 34 and houses a source region 41, of N⁺-type, and a body contact region 42, P⁺-type. The portion of the body region 40 between the source region 41 and the pocket 31 therefore forms a channel region 43. A polysilicon structure 45, having a general shape similar to the gate region 15 of FIG. 1, extends along the whole edge of the active area 34, partly on the bird's beak-shaped portion of the field oxide layer 33, partly on top of the active area 34.

The polysilicon structure 45 is divided here in two parts extending at short distances but electrically isolated and comprises a gate region 46 (on the right in FIGS. 3 and 4), which surrounds on three sides the source region 41, and a non-operative region 47 (on the left in FIGS. 3 and 4), which surrounds on three sides the body contact region 42. In practice, the gate region 46 is only on top of the channel portion 43 of the body region 40. As may be seen in particular in FIG. 4, in which the polysilicon structure 45 has been shown with dash lines for the sake of clarity, the non-operative region 47 and the gate region 46, respectively C-shaped and inverted C-shaped, are facing but extend at a reciprocal distance d comprised between the lithographic minimum obtainable with the technology used and the width L of the polysilicon structure 45. In practice, the separation areas between the gate region 46 and the non-operative region 47 have at the most a square shape factor. This avoids introflection of the equipotential lines from the drain region 31 towards the source region 41 which would cause high electric field values due to the electric discontinuity. In practice, the polysilicon structure 45 maintains unchanged the field plate functions.

Here too, the gate regions 46 and the non-operative regions 47 are electrically insulated with respect to the pocket 1 by a thin gate oxide layer, not shown, and therefore form, with the pocket 1, respective parasitic capacities $C_{gd}$ and $C_s/C_{bd}$, represented with dashed lines.

Moreover, the source region 41, the body region 40 (through the body contact region 42) and the non-operative region 47 are electrically connected through a source/body contact line SB; the operative region 46 is biased through a gate contact G and the pocket N is biased through a drain contact D formed on the drain contact region 36.

Figure 4:
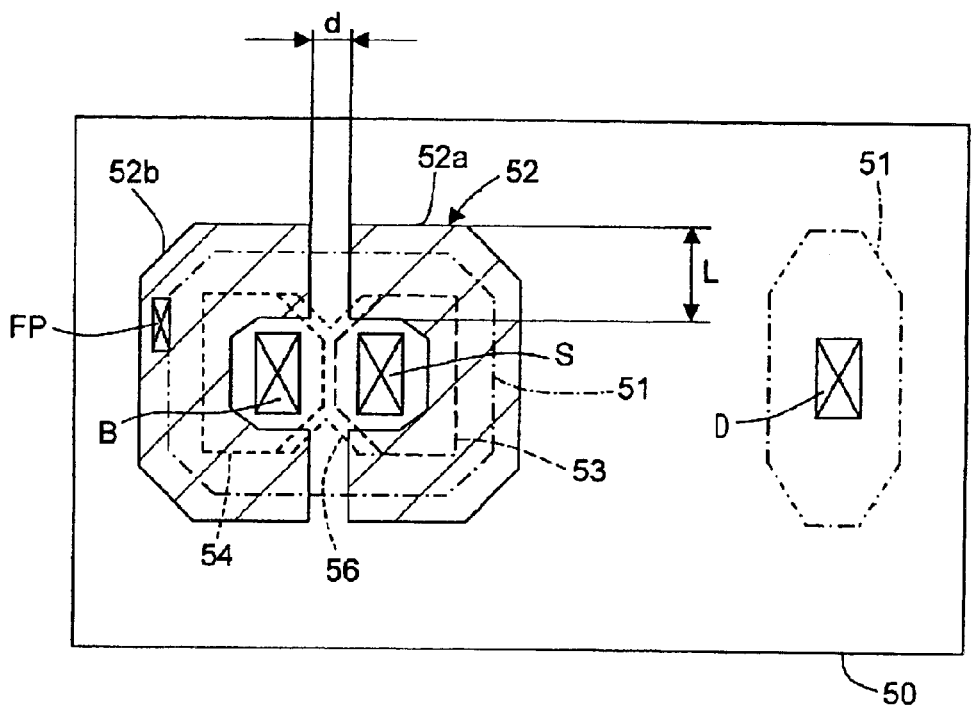
FIG. 4 shows the layout of the masks used for the device according to an exemplary embodiment of the invention in FIG. 3.

FIG. 4 shows the masks used for forming the device of FIG. 3; in particular, 50 indicates the drain mask; 51 the active area mask; 52 the gate mask; 53 the source mask and 54 the body contact mask. As may be seen, the gate mask 52 has two parts 52a, 52b respectively for the gate region 46 and the non-operative region 47. The mask 56 of the body region 40 is partially visible here since, near the opening between the non-operative region 47 and the gate region 46, it forms two indentations towards the inside, so as to prevent the doping agent, when forming the body region 40, from excessively diffusing laterally and spreading towards the field oxide layer 33 in the separation areas between the two parts of the polysilicon structure 45. For the rest, the mask 56 of the body region 40 coincides with the three outer sides of the masks 53 and 54. Moreover, the masks for the source 53 and the body contact 54 have beveled facing edges.

FIG. 4 also shows the drain contact D, as well as the source S, body B and field plate FP contacts connected to the source/body contact line SB.

Thereby, the facing area between the gate region 46 and the drain is reduced to about half, so the parasitic capacity $C_{gd}$ is reduced by a factor of about 2. In fact, due to the electrical isolation between the gate region 46 and the non-operative region 47, the source/body-drain parasitic capacity $C_{s/bd}$, has no influence on the cutoff frequency $F_t$. Vice-versa, the transconductance $g_m$ remains unvaried, since the source perimeter undergoes no variations. Consequently there is a distinct increase (theoretically double) of the value of the cutoff frequency $F_t$, maintaining a minimum structure.

The device 30 is made using the same manufacturing steps as the device of the prior art and modifying only the gate mask as shown in FIG. 4. In practice, after defining the active areas, forming the gate oxide layer (not shown) and depositing a polysilicon layer, the later is shaped (using the gate mask 52) so as to form at the same time the non-operative region 47 and the gate region 46; then follows the implants for the body region 40 (using the mask 56), the body contact region 42 (using the mask 54) and the source region 41 (using the mask 53). Then the contacts S, B, G, D and FP and the interconnection lines are formed.

The advantages of the described exemplary embodiment are clear from the above description. In particular, it is clear that the solution described allows forming devices that have tailored frequency performances, though having minimum bulk, and without reducing the ability to withstand high voltages, which remains substantially unchanged, since the polysilicon structure is modified only by a minimum part and only a minimum portion is removed (separation areas between the gate region 46 and the non-operative region 47).

Finally it is clear that numerous modifications and variations may be made to the device described and illustrated, all falling within the scope of the invention, as defined in the appended claims. In particular, it is stressed that the same solution is also applicable to complementary PDMOS structures and to structures that need a field plate formed by the gate electrode and when it is intended to reduce the parasitic capacities due to the non-operative portions of the field plate. Moreover, if the source and body regions are not electrically connected, the non-operative region 47 of the polysilicon structure may be electrically connected to any one of the source and body regions. The polysilicon structure 45 may finally be divided into more than two parts located at a short distance, if this should be necessary for design reasons.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

What is claimed is:

1. An MOS electronic device comprising:
   a first conductive region;
   a field insulating layer, covering said first conductive region;
   a first opening in said field insulating layer having an edge and delimiting an active area;
   a body region housed in the active area;
   a second conductive region housed in the body region;
   a channel region formed by a portion of said body region positioned between said first and second conductive regions; and
   a polycrystalline silicon structure extending along said edge of said first opening partially on to of said field insulating layer and partially on top of said active area, said polycrystalline silicon structure including:
      a gate region extending along a first portion of said edge on top of said channel region and partially surrounding said second conductive region; and a non-operative region extending along a second portion of said edge, electrically insulated and at a distance from said gate region.

2. The device according to claim 1, wherein said first conductive region is a drain region, and said second conductive region is a source region.

3. The device according to claim 2, wherein said body region houses a body contact region at a distance from said source region and wherein said non-operative region partially surrounds said body contact region.

4. The device according to claim 3, wherein said non-operative region and said gate region are approximately C-shaped and inverted C-shaped, with arms aligned in pairs and separated by two separation areas.

5. The device according to claim 4, wherein said body region has side recesses near said separation areas.

6. The device according to claim 5, wherein said source region and body contact region have smoothed edges facing said side recesses.

7. The device according to claim 3, wherein said non-operative region is electrically connected to at least one of said source region and body contact region.

8. The device according to claim 2, wherein said field insulating layer has a second opening and a drain contact region extends in the drain region at said second opening.

9. The device according to claim 1, wherein said gate region and said non-operative region have a length and are arranged at a distance between a lithographic minimum and said length.

10. The device according to claim 1, forming a DMOS.

11. A MOS electronic device comprising:
   a channel region formed by a portion of a body region positioned between first and second conductive regions; and
   a polycrystalline silicon structure including:
      a gate region extending on top of the channel region and partially surrounding said second conductive region, and
      a non-operative region having a length and electrically insulated and at a distance from the gate region between a lithographic minimum and the length.

12. The MOS electronic device of claim 11 wherein the non-operative region and the gate region are so formed to be approximately C-shaped and inverted C-shaped with arms aligned in pairs and separated by two separation areas.

13. The MOS electronic device of claim 11 wherein the distance allows for a ratio of transconductance to parasitic capacity substantially equal to or greater than a power device of a 200V technology having a cutoff frequency of 3.2 GHz.

14. The MOS electronic device of claim 11 wherein the first conductive region is a drain region and the second conductive region is a source region.

15. An electronic device comprising:
   a first conductive region;
   a field insulating layer, covering the first conductive region, and having a first opening with an edge and delimiting an active area;
   a body region housed in the active area;
   a second conductive region housed in the body region;
   a channel region formed by a portion of the body region positioned between the first and second conductive regions;
   a gate region extending along a first portion of the edge on top of the channel region; and
   a third conductive region overlying an opposite portion of the edge from the gate region, electrically insulated and at a distance from the gate region.

16. The device according to claim 15, wherein the first conductive region is a drain region, and the second conductive region is a source region.

17. The device according to claim 16, wherein the body region houses a body contact region at a distance from the source region and wherein the third conductive region partially surrounds the body contact region.

18. The device according to claim 17, wherein the third conductive region and the gate region are approximately C-shaped and inverted C-shaped, with arms aligned in pairs and separated by two separation areas.

19. The device according to claim 18, wherein the body region has side recesses near said separation areas.

20. The device according to claim 17, wherein the third conductive region is electrically connected to either the source region or the body contact region.

21. The device according to claim 19, wherein the source region and body contact region have smoothed edges facing the side recesses.

22. The device according to claim 15, wherein the gate region and the third conductive region have a length and are arranged at a distance between a lithographic minimum and the length.

23. The device according to claim 15, wherein the field insulating layer has a second opening and a drain contact region that extends into the drain region at the second opening.

* * * * *

UNITED STATES PATENT AND TRADEMARK OFFICE
CERTIFICATE OF CORRECTION

PATENT NO. : 6,906,389 B2
DATED : June 14, 2005
INVENTOR(S) : Riccardo Depetro et al.

It is certified that error appears in the above-identified patent and that said Letters Patent is hereby corrected as shown below:

<u>Column 4,</u>
Line 62, "on to of said field" should read as -- on top of said field --.

Signed and Sealed this

Fourth Day of October , 2005

JON W. DUDAS
*Director of the United States Patent and Trademark Office*

UNITED STATES PATENT AND TRADEMARK OFFICE
CERTIFICATE OF CORRECTION

PATENT NO. : 6,906,389 B2
DATED : June 14, 2005
INVENTOR(S) : Riccardo Depetro et al.

It is certified that error appears in the above-identified patent and that said Letters Patent is hereby corrected as shown below:

<u>Title page,</u>
Item [75], Inventors, the second inventor's town of residence should read -- Cornedo Vicentino --.

Signed and Sealed this

Twenty-first Day of March, 2006

JON W. DUDAS
*Director of the United States Patent and Trademark Office*